(12) United States Patent
Burke et al.

(10) Patent No.: US 6,955,937 B1
(45) Date of Patent: Oct. 18, 2005

(54) CARBON NANOTUBE MEMORY CELL FOR INTEGRATED CIRCUIT STRUCTURE WITH REMOVABLE SIDE SPACERS TO PERMIT ACCESS TO MEMORY CELL AND PROCESS FOR FORMING SUCH MEMORY CELL

(75) Inventors: Peter A. Burke, Portland, OR (US); Sey-Shing Sun, Portland, OR (US); Hong-Qiang Lu, Lake Oswego, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/917,551

(22) Filed: Aug. 12, 2004

(51) Int. Cl.[7] ............................................. H01L 21/00
(52) U.S. Cl. ........................ 438/53; 438/209; 257/296
(58) Field of Search .......................... 438/53, 216, 67, 438/156, 175, 209, 99; 257/296, 17, 213, 257/288, 40, 306, 309, 531

(56) References Cited

U.S. PATENT DOCUMENTS

| | | | |
|---|---|---|---|
| 3,448,302 A | 6/1969 | Shanefield | |
| 4,845,533 A | 7/1989 | Pryor et al. | 357/2 |
| 4,853,893 A | 8/1989 | Eaton, Jr. et al. | 365/145 |
| 4,876,667 A | 10/1989 | Ross et al. | 365/113 |
| 4,888,630 A | 12/1989 | Paterson | 357/23.5 |
| 5,198,994 A | 3/1993 | Natori | 365/145 |
| 6,044,008 A | 3/2000 | Choi | 365/145 |

(Continued)

FOREIGN PATENT DOCUMENTS

| | | | |
|---|---|---|---|
| WO | WO 01/03208 | 1/2001 | H01L 45/00 |

OTHER PUBLICATIONS

Rueckes, Thomas, et al., "Carbon Nanotube-Based Nonvolatile Random Access Memory for Molecular Computing", Science, vol. 289, Jul. 7, 2000, pp. 94-97.

Primary Examiner—Lynne A. Gurley
Assistant Examiner—Andre' Stevenson
(74) Attorney, Agent, or Firm—John P. Taylor (57) ABSTRACT

A carbon nanotube memory cell for an integrated circuit wherein a chamber is constructed in a layer of a dielectric material such as silicon nitride down to a first electrical contact. This chamber is filled with polysilicon. A layer of a carbon nanotube mat or ribbon is formed over the silicon nitride layer and the chamber. A dielectric material, such as an oxide layer, is formed over the nanotube strips and patterned to form an upper chamber down to the ribbon layer to permit the ribbon to move into the upper chamber or into the lower chamber. The upper chamber is then filled with polysilicon. A silicon nitride layer is formed over the oxide layer and a contact opening is formed down to the ribbon and filled with tungsten that is then patterned to form metal lines. Any exposed silicon nitride is removed. A polysilicon layer is formed over the tungsten lines and anisotropically etched to remove polysilicon on the horizontal surfaces but leave polysilicon sidewall spacers. A silicon oxide layer is deposited over the structure and also anisotropically etched forming silicon oxide sidewall spacers on the polysilicon sidewall spacers. The polysilicon is wet etched with an etchant selective to adjacent materials to remove the polysilicon sidewalls spacers and all of the polysilicon in the chambers. Silicon oxide is formed over the structure and into the upper portion of the openings to seal the now empty chambers. A passivation layer may then be formed.

21 Claims, 8 Drawing Sheets

U.S. PATENT DOCUMENTS

| | | | |
|---|---|---|---|
| 6,128,214 A | 10/2000 | Kuekes et al. | 365/151 |
| 6,159,620 A | 12/2000 | Heath et al. | 428/615 |
| 6,198,655 B1 | 3/2001 | Heath et al. | 365/151 |
| 6,643,165 B2 | 11/2003 | Segal et al. | 365/151 |
| 6,858,891 B2 * | 2/2005 | Farnworth et al. | 257/296 |
| 2003/0168683 A1 * | 9/2003 | Farnworth et al. | 257/296 |
| 2003/0170930 A1 * | 9/2003 | Choi et al. | 438/99 |
| 2004/0027889 A1 * | 2/2004 | Occhipinti et al. | 365/202 |
| 2004/0031975 A1 * | 2/2004 | Kern et al. | 257/213 |
| 2004/0214366 A1 * | 10/2004 | Segal et al. | 438/53 |

* cited by examiner

CARBON NANOTUBE MEMORY CELL FOR INTEGRATED CIRCUIT STRUCTURE WITH REMOVABLE SIDE SPACERS TO PERMIT ACCESS TO MEMORY CELL AND PROCESS FOR FORMING SUCH MEMORY CELL

BACKGROUND OF THE INVENTION

1. Field of the Invention

This invention relates to memory cells for integrated circuit structures. More particularly, this invention relates to the formation of non-volatile memory cells having carbon nanotube ribbons comprising a matted layer or non-woven fabric of nanotubes.

2. Description of the Related Art

Many different types of memory are used in integrated circuit structures, including read only memory (ROM), programmable read only memory (PROM), electrically programmable read only memory (EPROM), electrically erasable programmable read only memory (EEPROM), dynamic random access memory (DRAM), and static random access memory (SRAM). Important characteristics of memory cells include low cost, programmability (ability to write to), erasability, nonvolatility, high density, low power, and high speed. Some of the above listed types of memory cells possess some of the features listed above, but are lacking in other features.

Read only memory (ROM) cells can be procured or made at relatively low cost, but cannot be rewritten by the user. Other memory types such as PROMs, can only be written to once, while EPROMs have long erase times, and EEPROMs has long write cycles and low relative speeds compared to Ram memory structures us as DRAM and SRAM memory cells.

Dynamic random access memory cells (DRAMs) are much faster than ROM type devices. But ROM devices have non-volatile memories, while DRAM memory cells must be continuously refreshed and therefore require further electrical circuitry. Furthermore, although SRAMs do not require the refreshing of DRAMs and are faster than DRAMs, they are of higher density and more expensive to produce.

Existing memory cell technologies, therefore, are either non-volatile but not randomly accessible and have low density, high cost, and limited ability to allow multiple high reliability writes; or they are volatile and have complicated system designs or have low density. More recently other emerging technologies have attempted to address these shortcomings.

Magnetic RAM cells (MRAM) or ferromagnetic RAM cells (FRAM) utilizes the orientation of magnetization or a ferromagnetic region to generate a nonvolatile memory cell. However, both of these types of memory cells have relatively high resistance and low-density. MRAM utilizes a magneto resistive memory element involving the anisotropic magneto resistance or giant magneto resistance of ferromagnetic materials yielding nonvolatility. FRAM uses a circuit architecture similar to DRAM, but which uses a thin film ferroelectric capacitor. This capacitor is purported to retain its electrical polarization after an externally applied electric field is removed yielding a nonvolatile memory. FRAM suffers from a large memory cell size, and it is difficult to manufacture as a large-scale integrated component. See U.S. Pat. Nos. 4,853,893; 4,888,630; and 5,198,994. A different memory cell, based upon magnetic tunnel junctions, has also been examined but has not led to large-scale commercialized devices.

Phase change memory comprises another technology having non-volatile memory. This technology stores information via a structural phase in thin-film alloys incorporating elements, such as selenium or tellurium. These alloys are purported to remain stable in both crystalline and amorphous states allowing the formation of a bi-stable switch. While the nonvolatility condition is met, this technology appears to suffer from slow operations, difficulty of manufacture, and reliability, and has not reached a state of commercialization. See U.S. Pat. Nos. 3,448,302; 4,845,533; 4,876,667; and 6,044,008.

Another technology which has been proposed for memory cell devices is wire crossbar memory (MWCM). See U.S. Pat. Nos. 6,128,214; 6,159,620; and 6,198,655. These memory technology proposals envision molecules as bistable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain nonvolatility owing to the inherent instability found in redox processes.

The use of nanoscopic wires, such as single-walled carbon nanotubes, has been proposed to form crossbar junctions to serve as memory cells. See WO01/03208, Nanoscopic Wire-Based Devices, Arrays, and Method of Their Manufacture; and Thomas Rueckes et al., "Carbon Nanotube-Based Nonvolatile Random Access Memory for Molecular Computing," *Science*, Vol. 289, pp. 94–97, Jul. 7, 2000. Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

However, the in situ formation of individual carbon nanotubes by, for example, directed growth or chemical self-assembly techniques to grow the individual carbon nanotubes is believed to be difficult to employ at commercial scale using modern technology. Furthermore, there may be inherent limitations such as the length of the carbon nanotubes that may be grown reliably using these techniques, and it may be difficult to control the statistical variance of geometries of carbon nanotubes so grown.

More recently in Segal et al. U.S. Pat. No. 6,643,165, issued Nov. 4, 2003, it has been proposed to form a carbon nanotube memory cell for an integrated circuit structure using a ribbon or mat of carbon nanotubes. The description of such a carbon nanotube memory structure found in Segal et al. U.S. Pat. No. 6,643,165 is hereby incorporated herein by reference. While the Segal et al. patent addresses at least some of the problems usually associated with formation of memory cells, the formation of a sealed chamber in the integrated circuit structure within which the carbon nanotube ribbon structure may move from an "on" state and an "off" state remains a challenge.

SUMMARY OF THE INVENTION

This invention comprises an improved carbon nanotube memory cell for an integrated circuit structure, and a method of making such an improved memory cell, wherein a first chamber is constructed by forming an opening or lower chamber in and through a layer of a dielectric material such as silicon nitride down to a first electrical contact point. This lower chamber is then temporarily filled with removable material such as, for example, silicon, e.g., polysilicon. A layer of a carbon nanotube mat or ribbon is then formed over the silicon nitride layer and the silicon-filled lower chamber therein. The carbon nanotube ribbon layer is then patterned, if desired, to form strips of the carbon nanotube ribbon layer of a dielectric material, such as an oxide layer, is then formed over the nanotube strips, and this dielectric layer is then patterned to form an opening in the oxide layer down to the underlying carbon nanotube ribbon layer which will function as the upper chamber for the memory cell. This upper chamber formed in the oxide layer over the carbon nanotube ribbon layer or strip is formed in registry with the earlier formed lower chamber to permit the carbon nanotube ribbon to mover upwards into the upper chamber or downwards into the lower chamber. The upper chamber, like the lower chamber, is then filled with a removable filler material such as silicon, e.g., polysilicon. A further dielectric layer, such as a silicon nitride layer, is then formed over the oxide layer and upper silicon filler material, and a contact opening is then formed through both the oxide and nitride layers down to the carbon nanotube ribbon. After forming any desired or needed liner layers, the contact opening down to the carbon nanotube ribbon is filled with an electrically conductive material such as, for example, tungsten, by optionally forming a thin liner or liners in the contact opening (usually a metal or metal compound), and then depositing a layer of the tungsten metal over the entire structure. The tungsten layer (and any electrically conductive liner layers, if present) is then patterned to form metal lines and any exposed silicon nitride is also removed.

In accordance with the invention, a layer of a removable material such as polysilicon is then formed over the tungsten lines and the exposed portions of the underlying third dielectric layer (e.g., the second silicon oxide layer). This polysilicon layer is then subject to an anisotropic etch to remove all of the polysilicon on the horizontal surfaces of the structure, leaving polysilicon sidewall spacers only on the raised sidewalls of the tungsten lines. A further silicon oxide layer is then deposited over the structure and this further silicon oxide layer is then also subjected to an anisotropic etch. This results in the formation of silicon oxide sidewall spacers formed on the exposed outer sidewalls of the just previously formed polysilicon sidewall spacers. However, the upper surface of the inner polysilicon sidewall spacers is not covered by the subsequently formed silicon oxide spacers.

In accordance with the invention, the structure is then subject to a polysilicon wet etch with an etchant selective to adjacent materials (silicon oxide, tungsten metal, silicon nitride, and the carbon nanotubes) such as tetramethly ammonium hydroxide to first remove the polysilicon sidewalls spacers and then to remove all of the polysilicon in the two chambers. A further layer of silicon oxide is then formed over the structure and into the upper portion of the openings formed by the previous removal of the polysilicon sidewall spacers, thereby sealing the now empty chambers. A passivation layer, if necessary, may then be formed over the structure to complete the formation of the carbon nanotube memory cell structure.

DETAILED DESCRIPTION OF THE INVENTION

Figure 1:
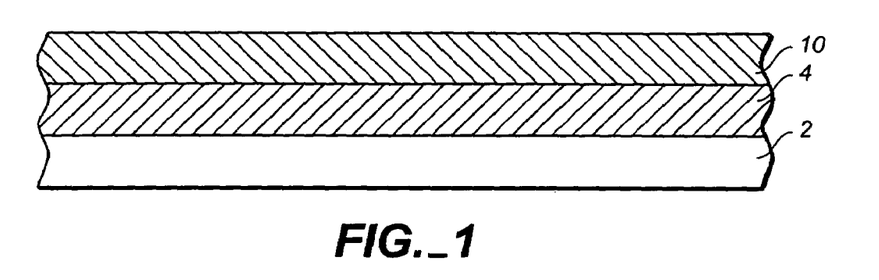
FIG. 1 is a vertical fragmentary cross-sectional view showing a dielectric layer formed over a substrate with an electrically conductive member shown formed over the dielectric layer.

Turning now to FIG. 1, a base layer 2 is shown which may comprise a silicon wafer or a glass substrate, or the like. Alternatively, base layer 2 may represent multiple underlying layers of integrated circuit structure. When base layer 2 comprises silicon, such as, for example, a silicon wafer, a thin layer of native oxide (not shown) may be found on the silicon surface which will facilitate bonding of subsequent layers to base layer 2. Over base layer 2 is formed a first dielectric layer 4, which may have a thickness ranging from about 200 nanometers (nm) to about 1000 nm. Preferably, first dielectric layer 4 will comprise a silicon oxide layer to facilitate bonding to base layer 2. By way of illustration, and not of limitation, dielectric layer 4 will be hereinafter referred to herein as first silicon oxide layer 4.

Figure 1A:
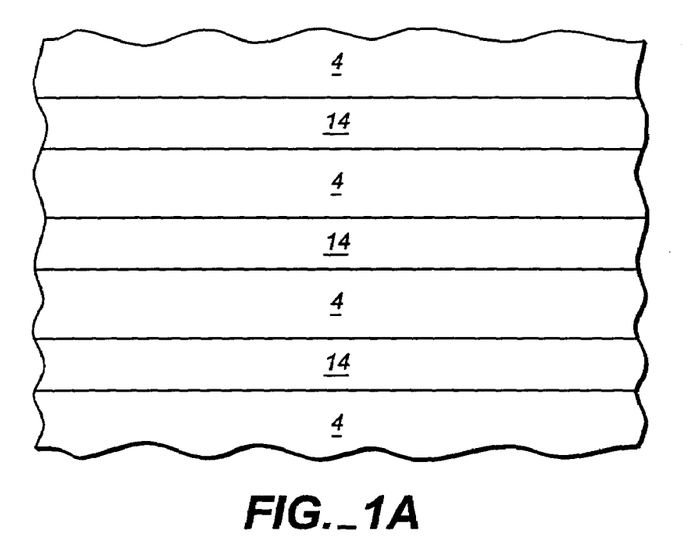
FIG. 1A is a top view showing a plurality of such electrically conductive members formed as metal lines over the dielectric layer.

A first metal layer 10 such as aluminum or tungsten is then formed over first silicon oxide layer 4. First metal layer 10 may range in thickness from about 200 nm, to about 1000 nm. It will be understood that thin layers of electrically conductive liner materials (which may be, for example, less than 10% of the thickness of the main metal layer) may be utilized, depending upon the choice of materials for the main metal layer, to avoid undesirable interactions between materials. Unless otherwise specified, the metal referred to will be presumed to comprise the main metal material, as well as any liner material where needed. Metal layer 10 may then be patterned, if desired, to form first metal lines 14, as shown in FIG. 1A.

Figure 2:
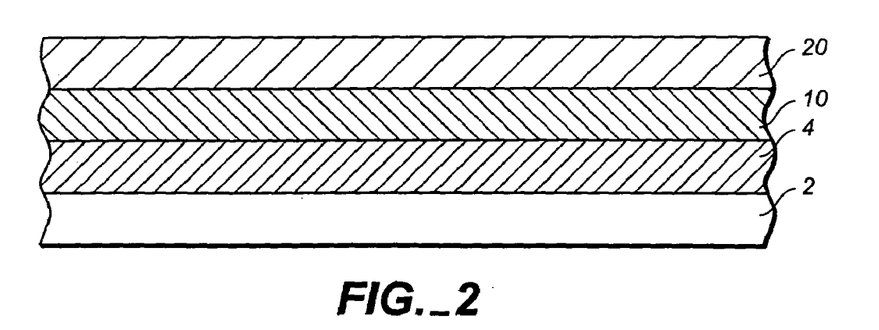
FIG. 2 is a vertical fragmentary cross-sectional view of the structure of FIG. 1, showing a further dielectric layer formed over the patterned metal layer.

As shown in FIG. 2, a second dielectric layer 20 is then formed over metal lines 14 and exposed portions of underlying oxide layer 4. While second dielectric layer 20 may be formed of any one of a number of dielectric materials, such as silicon oxide, silicon nitride, silicon carbide, or the like, it is preferable that the dielectric material selected for layer 20 not be the same as the dielectric material used for layer 4 to permit selective etching of either dielectric layer. Therefore, by way of illustration, and not of limitation, dielectric layer 20 will be hereinafter referred to herein as first silicon nitride layer 20. The thickness of first silicon nitride layer 20 may range from about 8 nm to about 30 nm. Control of the thickness (height) of first silicon nitride layer 20 is very important since this will determine the height of the lower chamber of the memory cell. This height of lower chamber 24 will further define the distance between the carbon nanotube strip to be explained below and the lower electrode 10 of the memory cell.

Figure 3:
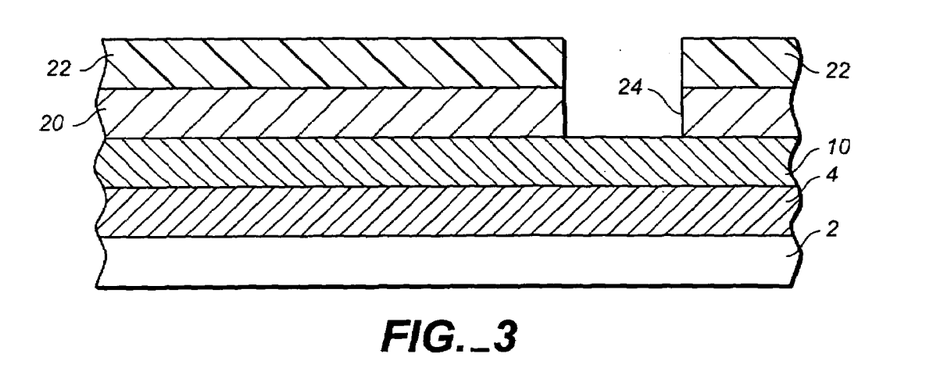
FIG. 3 is a vertical fragmentary cross-sectional view of the structure of FIG. 2 showing the second dielectric layer patterned to form a first chamber.
Figure 4:
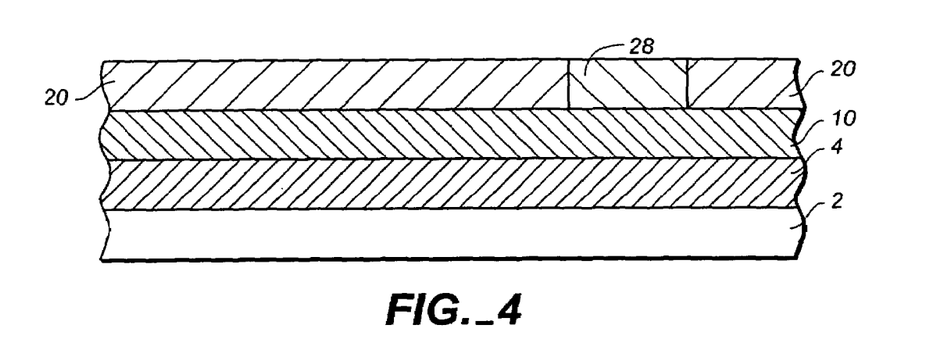
FIG. 4 is a vertical fragmentary cross-sectional view of the structure of FIG. 3 showing the first chamber of FIG. 3 filled with removable silicon filler material.

First nitride layer 20 is then patterned, as shown in FIG. 3, using resist mask 22 and a dry etching system, such as an upper electrode (HF) and biased wafer plate LAM Etcher using $CF_4$, $CHF_3$ chemistry; with the upper electrode set on about 300 watts and the lower electrode set at about 15 watts (or −70 volts) on the LAM Etcher, to form a lower chamber 24 in first nitride layer 20, which opening extends down respectively to underlying metal layer 10. After removal of chamber opening resist mask 22, a first layer of a material capable of being subsequently removed by a wet etch such as, for example, silicon, (e.g., polysilicon), is then deposited over first silicon nitride layer 20 to fill lower chamber 24. The structure is then subjected to a CMP step to remove all of the silicon on the surface of nitride layer 20, leaving only a silicon filler material 28 filling lower chamber 24, as shown in FIG. 4.

Figure 5:
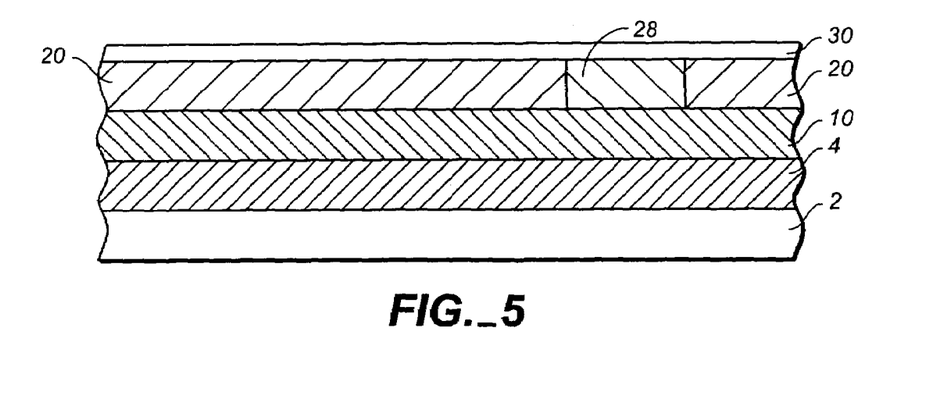
FIG. 5 is a vertical fragmentary cross-sectional view of the structure of FIG. 4 showing a carbon nanotube mat or layer formed over the second dielectric layer and the silicon filler material in the first chamber.
Figure 5A:
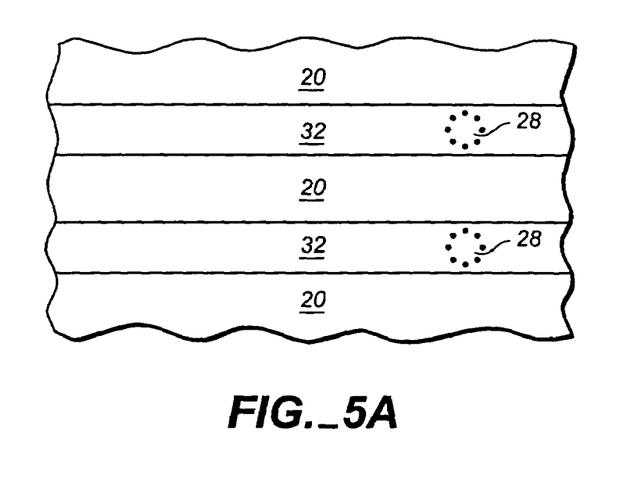
FIG. 5A is a top view of the structure of FIG. 5 showing the carbon nanotube layer patterned in strips, each of which partially covers a silicon-filled first chamber.

A carbon nanotube layer 30, comprising a non-woven porous fabric of entangled or matted carbon nanotubes, is then formed over first silicon nitride layer 20 and silicon filler 28, as seen in FIG. 5. Such a porous non-woven fabric of entangled or matted carbon nanotubes is described in detail in Segal et al. U.S. Pat. No. 6,643,165, the subject of which is hereby incorporated herein by reference. Carbon nanotube layer 30 is then patterned to form a plurality of porous carbon nanotube strips or ribbons 32, each of which passes over a separate lower chamber 24 filled with silicon filler material 28, as seen in FIG. 5A.

Figure 6:
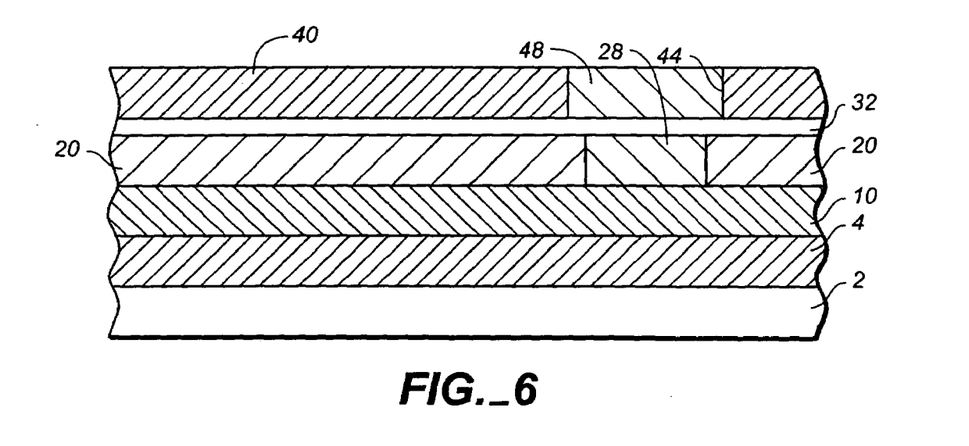
FIG. 6 is a vertical fragmentary cross-sectional view of the structure of FIG. 5 showing the formation of a further dielectric layer (e.g., a silicon oxide layer) formed over the patterned carbon nanotube strip and a second (upper) silicon-filled chamber shown formed in this dielectric (oxide) layer above the carbon nanotube strip.

A third dielectric layer 40 is then formed over the nanotube strips 32, as shown in FIG. 6. While the dielectric material selected for use as the third dielectric layer may comprise any one of a number of dielectric materials, such as silicon oxide, silicon nitride, silicon carbide, or the like, it is preferable that a different material be selected for use as third dielectric layer 40 than the dielectric material used for second dielectric layer 20 to permit selectivity in subsequent etching steps. Therefore, by way of illustration, and not of limitation, third dielectric layer 40 will be referred to herein to as second silicon oxide layer 40.

Second silicon oxide layer 40 is then patterned to form an upper chamber 44 over, and in general registry with, respective lower chamber 24. It will be noted that the thickness of second silicon oxide layer 40 will determine the height of upper chamber 44 of the memory cell. The thickness of second silicon oxide layer 40 should, therefore, range from about 8 nm to about 30 nm to thereby provide an upper chamber with a satisfactory height.

A second silicon (polysilicon) layer is then formed over the structure to fill upper chamber (opening) 44 with silicon. The remainder of the polysilicon layer is then removed by CMP or an equivalent removal system, leaving removable silicon (polysilicon) filler 48 in upper chamber 44, as seen in FIG. 6.

Figure 7:
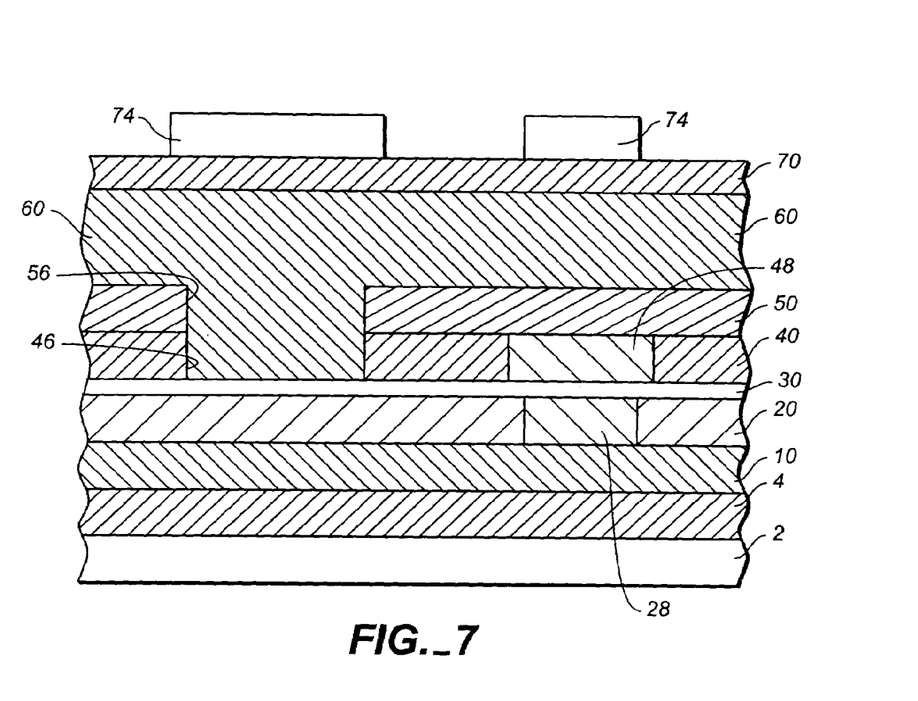
FIG. 7 is a vertical fragmentary cross-sectional view of the structure of FIG. 6 showing the formation of another dielectric layer (e.g., a silicon nitride layer) over the dielectric layer (such as silicon oxide) and the silicon-filled upper chamber, with a contact opening shown formed through both of the dielectric layers (the silicon oxide and silicon nitride layers) down to the carbon nanotube ribbon, with a layer of tungsten formed over the silicon nitride layer and in the contact opening, a further dielectric layer such as a further silicon oxide shown formed over the tungsten layer, and a photoresist mask formed over the further silicon oxide layer to permit formation of tungsten lines.

A fourth dielectric layer 50 is then formed over second silicon oxide layer 40, as shown in FIG. 7. As discussed previously with respect to other layers of dielectric materials, while the dielectric material selected for use as the fourth dielectric layer may comprise any one of a number of dielectric materials, such as silicon oxide, silicon nitride, silicon carbide, or the like, it is preferable that a different material be selected for use as fourth dielectric layer 50 than the dielectric material used for third dielectric layer 40 to permit selectivity in subsequent etching steps. Therefore, by way of illustration, and not of limitation, fourth dielectric layer 50 will be referred to herein to as second silicon nitride layer 50.

Second nitride layer 50 is then masked and dry etched down to underlying second oxide layer 40 to form a contact opening 56 in nitride layer 50. Using contact opening 56 as a mask, the exposed portion of second oxide layer 40 is then wet etched down to the underlying nanotube ribbon 32 to form a corresponding contact opening 46 in oxide layer 40. A layer of metal 60 such as tungsten (as well as appropriate liner layers) is then formed over nitride layer 50 to fill contact openings 46 and 56 to provide a metal contact down to nanotube ribbon 32, as seen in FIG. 7. Appropriate thin lines of metal and/or metal compounds, as needed, are first formed on the surfaces of the contact openings 46 and 56, and main metal layer, e.g., tungsten, is then formed. For example, when the contact filler metal or metal line is tungsten, a titanium layer may be first applied to enhance adhesion of the subsequent layers, including the main tungsten layer. Over the titanium layer may then be formed a sputtered titanium nitride layer, followed by formation of the main tungsten layer.

Figure 8:
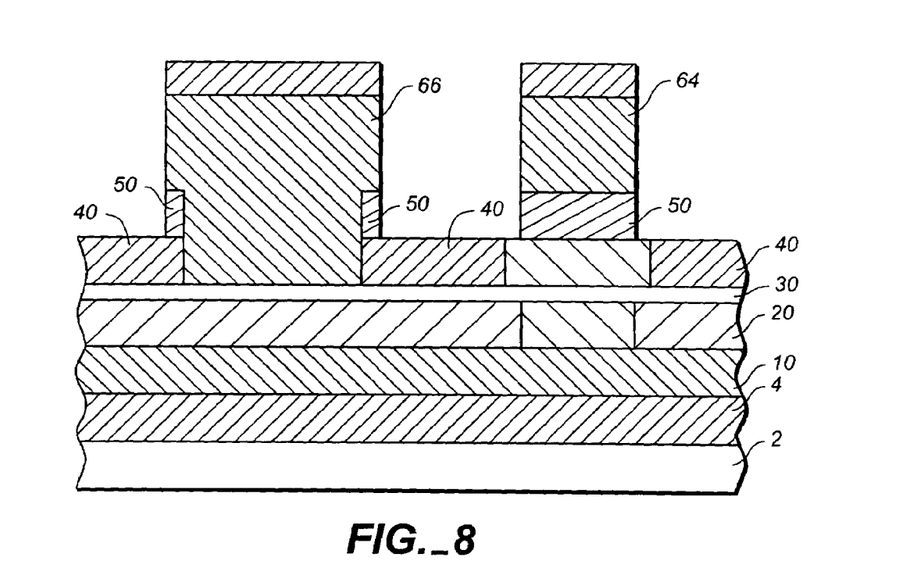
FIG. 8 is a vertical fragmentary cross-sectional view of the structure of FIG. 7 showing the patterning of the silicon nitride/tungsten/silicon oxide layers to form to form tungsten lines and a narrow strip of silicon nitride/tungsten/silicon oxide over the center portion of the silicon-filled upper chamber.

The tungsten layer is then planarized and a further oxide layer 70 is then formed over tungsten layer 60. A photoresist mask 74 is then formed over oxide layer 70 and the composite of oxide layer 70, tungsten layer 60, any liner layers present, such as, for example, 1200 Å of TiN (not shown), and exposed regions of silicon nitride layer 50 are then etched to form lines hereinafter referred to as tungsten lines 64 and 66, as seen in FIG. 8.

Figure 9:
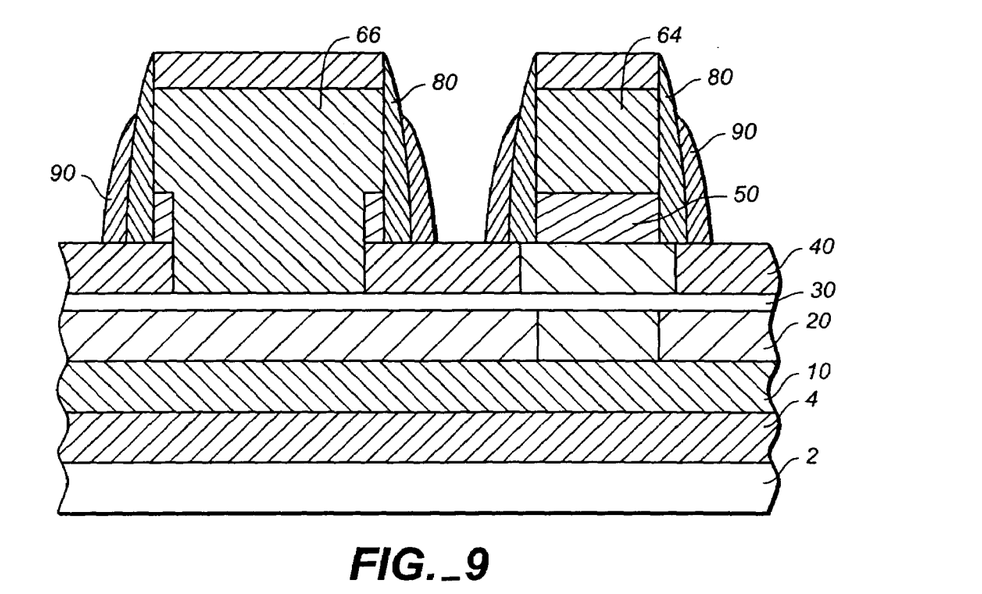
FIG. 9 is a vertical fragmentary cross-sectional view of the structure of FIG. 8 after formation of a silicon layer over the structure, followed by anisotropically etching of the silicon layer to form silicon sidewall spacers on the sidewalls of the silicon nitride/tungsten/silicon oxide line, followed by formation of a further layer of silicon oxide over the structure followed by anisotropic etching to form a set of silicon oxide sidewall spacers next to the silicon sidewall spacers.

A silicon layer (not shown) is then formed over the structure, and the silicon layer is then anisotropically etched to form silicon sidewall spacers 80 on the sidewalls of tungsten layers 80, as seen in FIG. 9. As will be discussed below, the thickness of the silicon layer used to form silicon sidewall spacers 80 will directly affect the size of the openings formed to permit removal of silicon filler material 28 and 48 respectively found in lower chamber 24 and upper chamber 44. The thickness of the silicon layer used to form silicon sidewall spacers 80 should range from about 30 nm to about 200 nm, and preferably should range from about 40 nm to about 70 nm. The anisotropic etch used to form silicon sidewall spacers 80 should comprise an $HBr/Cl_2/O_2$ plasma etch carried out at a pressure range of from about 3 mtorr to about 500 mtorri, and a temperature ranging from about 20° C. to about 100° C. for a period of time sufficient to provide an overetch of from about 10% to about 100%.

After the formation of silicon sidewall spacers 80, a further set of sidewall spacers 90 are formed on the exposed side walls of silicon spacers 80, as also seen in FIG. 9. Sidewall spacers 90 preferably are formed by anisotropic etching of a dielectric layer (not shown) formed over the structure after formation of silicon sidewall spacers 80. The dielectric layer used to form sidewall spacers 90 preferably will comprise silicon oxide to facilitate etch selectivity during the subsequent removal of silicon sidewall spacers 80. Other materials exhibiting similar etch selectivity may be used instead of silicon oxide to form silicon oxide sidewall spacers 90. However, by way of illustration, and not of limitation, dielectric sidewall spacer 90 will hereinafter referred to as silicon oxide sidewall spacers 90.

While the thickness of the silicon oxide layer used to form silicon oxide sidewall spacers 90 is not as crucial as the thickness of silicon sidewall spacers 80 as discussed above, the silicon oxide layer used to form silicon oxide sidewall spacers 90 should be at least 25 nm to ensure sufficient silicon oxide sidewall spacer 90 thickness to withstand the etch removal of the silicon sidewall spacers and the underlying silicon filler material in chambers 24 and 44.

Figure 10:
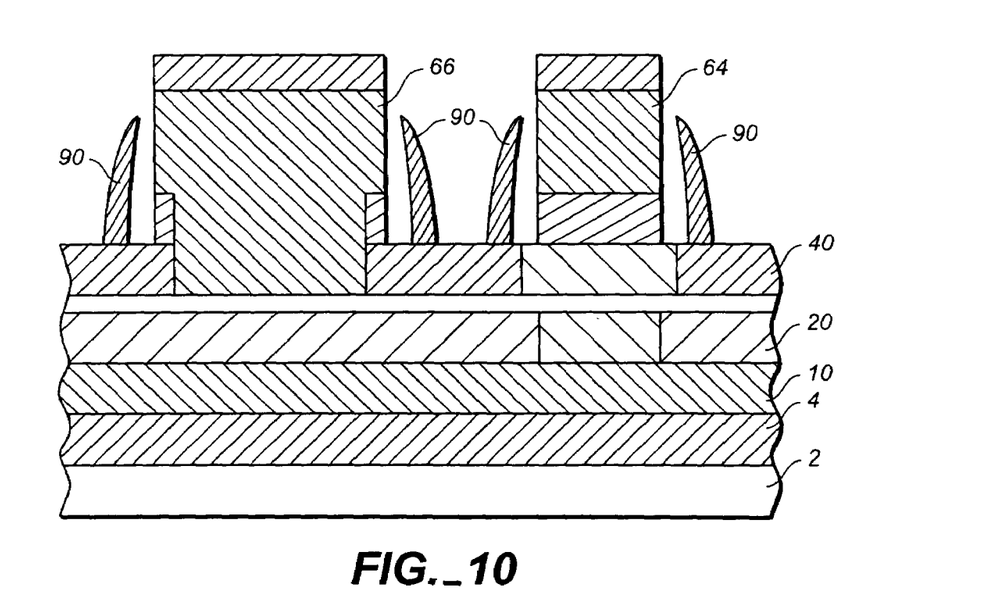
FIG. 10 is a vertical fragmentary cross-sectional view of the structure of FIG. 9, after removal of the silicon sidewall spacers, but prior to removal of the silicon from the upper and lower chambers.

After silicon oxide sidewall spacers 90 have been formed on the sidewalls of silicon sidewall spacers 80, silicon sidewall spacers 80 are removed, as shown in FIG. 10, by a wet etch selective to silicon oxide and other materials which are exposed to the wet etch other than silicon. Examples of such wet etchants which can be used for this selective wet etch include tetramethyl ammonium hydroxide (TMAH), ammonium hydroxide ($NH_4OH$), as well as isopropyl alcohol (IPA) and potassium hydroxide (KOH) solutions. Removal of silicon sidewall spacers 80 results in formation of passageways 84 between tungsten line 64 and silicon oxide spacers 90, leading down to chambers 44 and 24.

Figure 11:
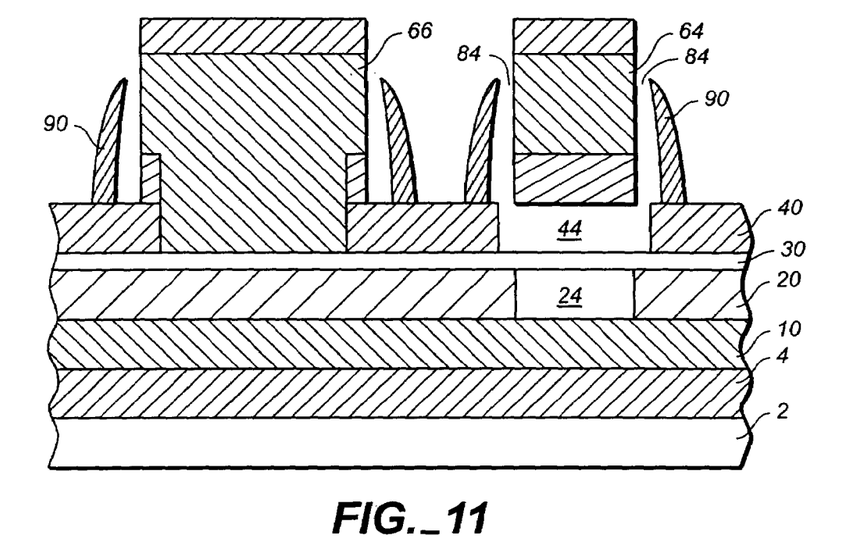
FIG. 11 is a vertical fragmentary cross-sectional view of the structure of FIG. 10, showing the empty upper and lower chambers after removal of after removal of the silicon filler material therein.
Figure 12:
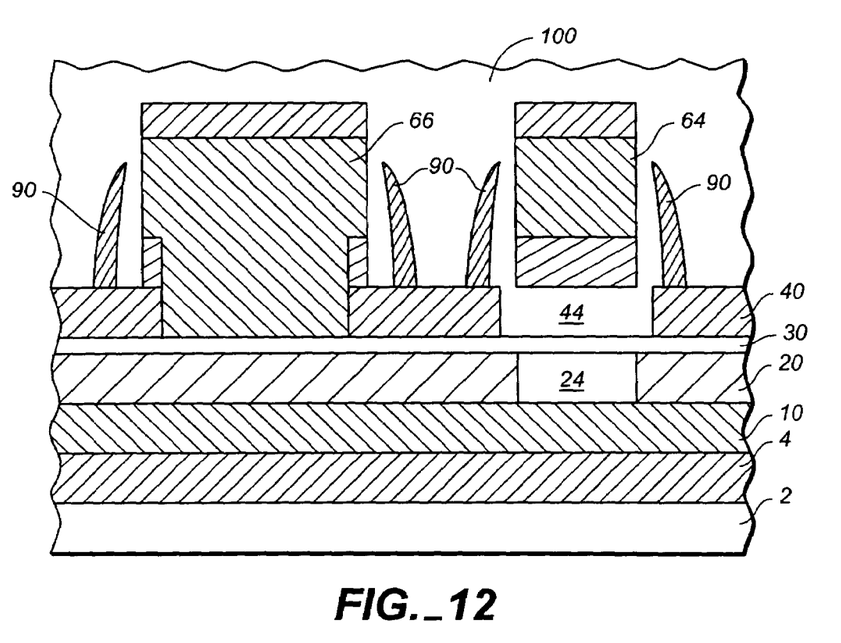
FIG. 12 is a vertical fragmentary cross-sectional view of the structure of FIG. 11 showing the formation of a further silicon oxide layer formed over the empty chambers to seal the chambers.

The same wet etch step is then used to etch away all of the silicon filler material in chambers 44 and 24. The wet etch step to remove both the silicon spacers 80 and the silicon filler material 28 and 48 in chambers 24 and 44 should be carried out at a temperatures of from about 10° C. to about 50° C. for a time period sufficient to remove all of the silicon filler material, but insufficient to cause damage to adjacent or adjoining materials such as the carbon nanotube ribbon or strip. Typically, the wet etch will be carried out for a period of from about 15 minutes to about 40 minutes. The result is shown in FIG. 11. After the wet etch removal of silicon filler material 28 and 48 from chambers 24 and 44, the structure may be sealed by application of a passivation layer of silicon oxide 100 over the structure, as shown in FIG. 12.

Figure 13:
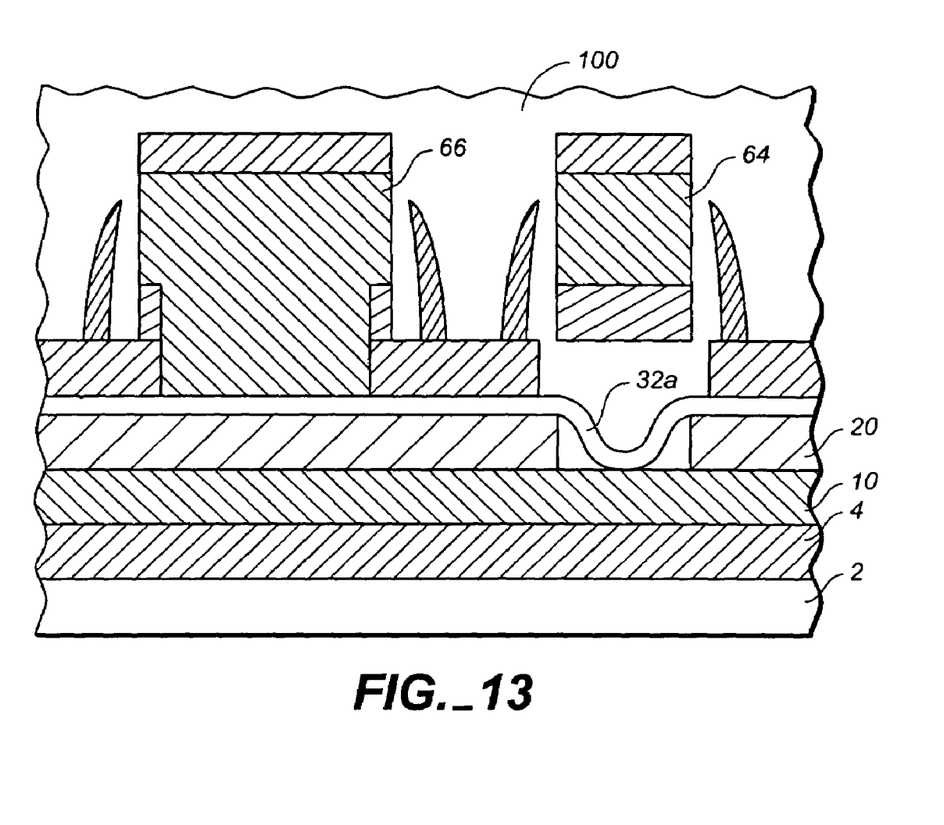
FIG. 13 is a vertical fragmentary cross-sectional view of the structure of FIG. 12 showing the carbon nanotube memory cell in an "on" position.

Referring now to FIG. 13, the carbon nanotube memory cell of the invention is show in an "on" or "1" position, with bent or distorted carbon nanotube ribbon 32a bent into contact with electrode layer 10 as a result of an attraction charge applied to electrode 10. Application of a more powerful attraction charge to the erase electrode (tungsten line 64) then pulls carbon nanotube strip 32 away from electrode 10 and back to the normal or flat "off" or "0" position.

Figure 14A:
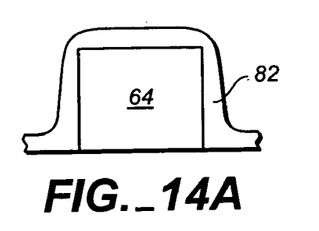
FIGS. 14A–14D and 15A–15D are vertical fragmentary cross-sectional views of the structure of FIG. 9 showing the effect the thickness of the silicon layer and the resulting silicon sidewall spacers can have on the width of the passageways down to the silicon-filled chambers to facilitate removal of the silicon filler material from the upper and lower chambers.
Figure 14B:
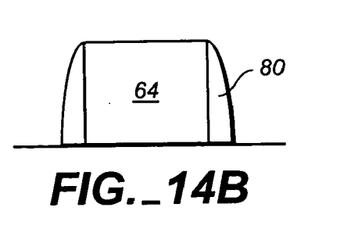
Figure 14C:
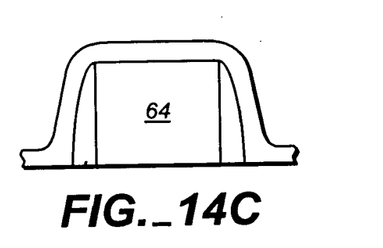
Figure 14D:
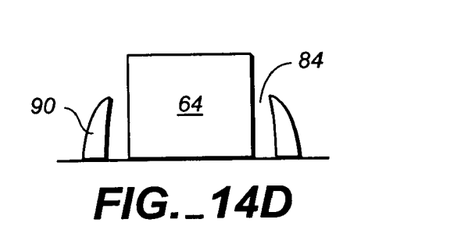
Figure 15A:
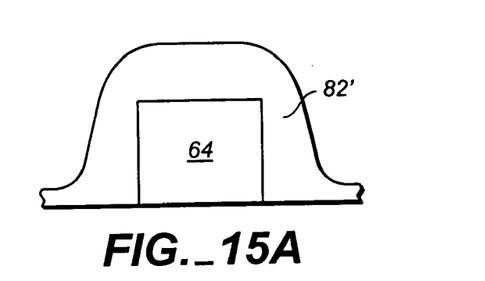
Figure 15B:
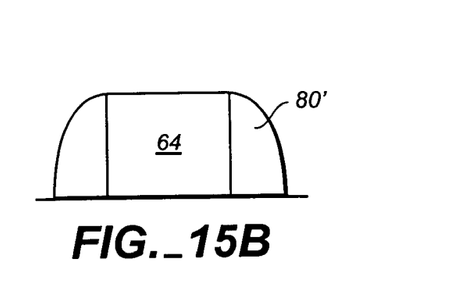
Figure 15C:
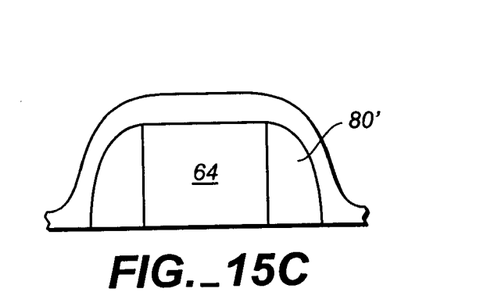
Figure 15D:
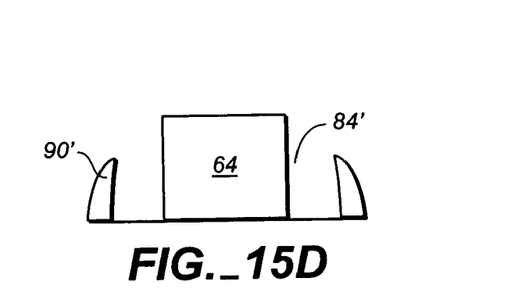

FIGS. 14A–14D and 15A–15D show sequentially the effect of the thickness of the silicon layer used to form silicon sidewall spacers 80 has on the subsequent formation of the passageways 84. In FIGS. 14A–14D the original silicon layer 82, as seen in FIG. 14A, is thin, resulting in formation of a small passageway 84, as seen in FIG. 14D. In contrast, formation of a much thicker initial silicon layer 82', as seen in FIG. 15A, result in formation of a larger passageway 84', in FIG. 15D. Formation of large passageways 84 between the tungsten metal line and the silicon oxide sidewall spacer facilitates easy removal of the silicon filler material during the wet etch step to remove the silicon filler from upper chamber 44 and lower chamber 24 in contrast to smaller passageways. However, the larger the passageway, the harder it will be to subsequently seal off the passageway without damaging chambers 24 and 44 in the memory cell. While the optimum size of the passageways may have to be determined empirically for each cell, maintaining a thickness of silicon layer 82 with a range of from about 10 nm to about 200 nm will, in general, be found to be generally acceptable for both removal of silicon filler material 28 and 48 material and subsequent sealing of chambers 24 and 44.

Figure 16:
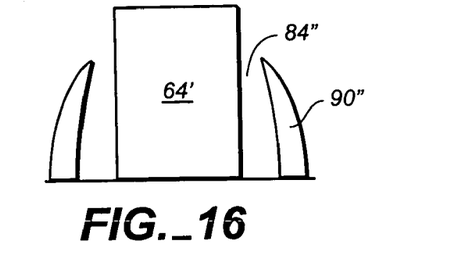
FIG. 16 is a cross-sectional view of the structure of FIG. 9 showing the effect the thickness (height) of the tungsten line and the resulting height of the silicon sidewall spacers can have on the aspect ratio of the passageways formed by removal of the silicon sidewall spacers down to the silicon-filled chambers to facilitate removal of the silicon from the upper and lower chambers.

FIG. 16 shows the result of an extension of the height of the metal line over which the silicon layer (not shown) is formed to form the silicon sidewall spacers. It will be readily appreciated that the aspect ratio of the resulting opening 84" (formed by subsequent removal of the silicon sidewall spacers) is higher when the height of line 64' is increased, as illustrated in FIG. 16, resulting in an opening much more easily sealed off. In the past, when it was desirable, for example, to fill a trench or a space between adjacent lines, it was found that high aspect ratio openings were much more susceptible to void formation due to the tendency to neck in at the top of the opening since the filler material deposited on both sides of the side surfaces at the same time, i.e., the horizontal deposition rate tended to be almost twice as fast as the vertical filling rate. In the present invention, such a high aspect ratio would be desirable o seal off the chambers, as long as the high aspect ratio did not unacceptably interfere with the etch step to remove the silicon filler material.

Thus, the invention provides for an easily sealable entranceway into the chambers to facilitate removal of the silicon filler material in the chambers by providing removable sidewall spacers between the sidewall of the metal line or electrode and an out set of sidewall spacers formed on the sidewall of the removable sidewall spacer. The size of the openings, formed by removal of the removable sidewall spacers, may be varied by controlling the initial thickness of the layer from which the removable spacers are formed, and/or by controlling the height of the line or electrode sidewall on which the removable spacer is formed.

Having thus described the invention what is claimed is:

1. A process for making a carbon nanotube memory cell for an integrated circuit structure which comprises:
   a) forming a first dielectric layer over a substrate;
   b) forming a first metal layer over said first dielectric layer;
   c) forming a second dielectric layer over said first metal layer;
   d) patterning said second dielectric layer to form an opening in said second dielectric layer down to said first metal layer, said opening comprising a first chamber in said second dielectric layer;
   e) filling said first chamber with a first removable material;
   f) forming a porous carbon nanotube ribbon layer over said second dielectric layer and said first removable material—filled first chamber therein;
   g) forming a third layer of dielectric material over said carbon nanotube ribbon layer;
   h) patterning said third dielectric layer to form an opening in said third dielectric layer down to said underlying carbon nanotube ribbon layer in registry with said first chamber formed in said second dielectric layer, whereby said opening in said third dielectric layer will function as an upper chamber for said memory cell in registry with said first chamber;
   i) filling said upper chamber with a second removable material;
   j) forming a fourth dielectric layer over the third dielectric layer and said second removable material-filled upper chamber therein;
   k) forming a contact opening in said third and fourth dielectric layers down to said porous carbon nanotube ribbon;
   l) forming a layer of conductive material over said fourth dielectric layer which fills said contact opening;
   m) patterning said layer of conductive material and said fourth dielectric layer thereunder to form at least one line of said conductive material over said contact opening and said filled upper chamber, the width of said line over said filled chamber being less than the width of said filled—upper chamber;
   n) forming a layer of a third removable material over said structure;
   o) anisotropically etching said layer of said third removable material to form first sidewall spacers of said third removable material on the sidewalls of said lines of conductive material;
   p) forming a further dielectric layer over said structure;
   q) anisotropically etching said further dielectric layer to form second sidewall spacers of said further dielectric material on the sidewalls of said first sidewall spacers of said third removable material;
   r) removing said first sidewall spacers of said third removable material to provide an opening to said filled upper chamber;
   s) removing said first and second material respectively in said lower and upper chambers through said opening formed by removal of said first sidewall spacers; and
   t) forming a dielectric layer over said structure to seal the opening leading to said upper and lower chambers.

2. The process for forming a carbon nanotube ribbon memory cell of claim 1 wherein said step of forming said first dielectric layer on a substrate further comprises forming said first dielectric layer over a silicon wafer.

3. The process for forming a carbon nanotube ribbon memory cell of claim 1 wherein said step of forming a first dielectric layer over a substrate further comprises the step of forming a first silicon oxide ($SiO_2$) layer over said substrate.

4. The process for forming a carbon nanotube ribbon memory cell of claim 1 wherein said step of forming a first metal layer comprises forming a main metal layer selected from the group consisting of tungsten, titanium, titanium nitride, tantalum, tantalum nitride, and aluminum.

5. The process for forming a porous carbon nanotube ribbon memory cell of claim 4 wherein said step of forming said first main metal layer further includes forming at least one electrically conductive liner layer formed over said first dielectric layer and beneath said main metal layer.

6. The process for forming a carbon nanotube ribbon memory cell of claim 5 wherein said step of forming said first main metal layer further comprises patterning said first main metal layer to form metal lines.

7. The process for forming a carbon nanotube ribbon memory cell of claim 3 wherein said step of forming a second dielectric layer further comprises forming over said first metal layer a silicon nitride dielectric layer having a thickness ranging from about 8 nm to about 30 nm.

8. The process for forming a carbon nanotube ribbon memory cell of claim 1 wherein said step of filling said first chamber with a first removable material comprises further comprises filling said first chamber with a first removable material capable of being selectively removed with a wet etch.

9. The process for forming a carbon nanotube ribbon memory cell of claim 8 wherein said step of filling said first chamber with a first removable material capable of being selectively removed with a wet etch further comprises filling said first chamber with silicon.

10. The process for forming a carbon nanotube ribbon memory cell of claim 1 including the further step of patterning said porous carbon nanotube ribbon to form strips.

11. The process for forming a carbon nanotube ribbon memory cell of claim 1 wherein said step of forming a third dielectric layer over said carbon nanotube ribbon layer further comprises forming a silicon oxide ($SiO_2$) layer over said carbon nanotube ribbon layer.

12. The process for forming a carbon nanotube ribbon memory cell of claim 11 wherein said step of forming a third dielectric layer further comprises forming over said carbon nanotube ribbon a silicon oxide (SiO$_2$) dielectric layer having a thickness ranging from about 8 nm to about 30 nm.

13. The process for forming a carbon nanotube ribbon memory cell of claim 1 wherein said step of filling said second chamber with a second removable material further comprises filling said second chamber with a material capable of being selectively removed with a wet etch.

14. The process for forming a carbon nanotube ribbon memory cell of claim 13 wherein said step of filling said second chamber with a second removable material capable of being selectively removed with a wet etch further comprises filling said second chamber with silicon.

15. The process for forming a carbon nanotube ribbon memory cell of claim 13 wherein said step of forming a fourth layer of dielectric material further comprises forming a layer of silicon nitride over said third layer of dielectric material.

16. The process for forming a carbon nanotube ribbon memory cell of claim 15 wherein said step of filling said upper chamber with a removable material comprises further comprises filling said upper chamber with a second removable material capable of being selectively removed with a wet etch.

17. The process for forming a carbon nanotube ribbon memory cell of claim 16 wherein said step of filling said upper chamber with a second removable material capable of being selectively removed with a wet etch further comprises filling said upper chamber with silicon.

18. The process for forming a carbon nanotube ribbon memory cell of claim 16 wherein said steps of filling said lower chamber with a first removable material, capable of being selectively removed with a wet etch, and said upper chamber with a second removable material capable of being selectively removed with a wet etch further comprises filling both said lower chamber and said upper chamber with the same removable material.

19. The process for forming a carbon nanotube ribbon memory cell of claim 15 wherein said step of forming a layer of conductive material which fills said contact opening further comprises filling said contact opening with tungsten.

20. In the formation of a carbon nanotube memory cell wherein a lower chamber is formed below a layer of carbon nanotubes, and an upper chamber is formed above said layer of carbon nanotubes, and in registry with said lower chamber, and both of said chambers are filled with a first removable material, the improvement which comprises:
   a) forming an electrode above said filled upper chamber, said electrode having a width less than the width of said upper chamber and generally in registry with said upper chamber;
   b) forming a layer of a second removable material over said structure, including said electrode;
   c) anisotropically etching said layer of said second removable material to form first sidewall spacers of said second removable material on the sidewalls of said electrode;
   d) forming over the resultant structure a layer of a material different from said second removable material;
   e) anisotropically etching said layer of a different material to form second sidewall spacers of said different material on the sidewalls of said first sidewall spacers;
   f) removing said first sidewall spacers of said second removable material to form one or more openings to said upper chamber;
   g) removing said first removable material from said upper chamber and said lower chamber through said openings formed by removal of said first sidewall spacers of said second removable material; and
   h) sealing said chambers after removal of all of said first removable material from said chambers.

21. In a carbon nanotube memory cell wherein a lower chamber is formed below a layer of carbon nanotubes, and an upper chamber is formed above said layer of carbon nanotubes, and in registry with said lower chamber, and both of said chambers have been previously filled with a removable filler material, the improvement which comprises:
   a) an electrode formed above said upper chamber, said electrode having a width less than the width of said upper chamber and generally in registry with said upper chamber;
   b) first sidewall spacers adjacent, but spaced from, the sidewalls of said electrode, and formed by
      i) forming a layer of a removable material over said structure, including said electrode;
      ii) anisotropically etching said layer of said removable material to form second sidewall spacers of said removable material on the sidewalls of said electrode;
      iii) forming over the resultant structure a layer of a material different from said removable material;
      iv) anisotropically etching said layer of a different material to form said first sidewall spacers on the sidewalls of said second spacers and spaced from the sidewalls of said electrode; and
      v) removing said second sidewall spacers of said removable material;
   c) one or more openings to said upper chamber formed by removal of said second sidewall spacers through which said removable filler material has been removed from said upper chamber and said lower chamber; and
   d) sealing materials formed above said chambers after said removal of all of said filler material from said chambers.

* * * * *